(12) United States Patent
Shiraki et al.

(10) Patent No.: US 7,639,060 B2
(45) Date of Patent: Dec. 29, 2009

(54) LEVEL SHIFT CIRCUIT

(75) Inventors: Satoshi Shiraki, Toyohashi (JP);
Hiroyuki Ban, Hazu-gun (JP); Junichi Nagata, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 51 days.

(21) Appl. No.: 12/076,521

(22) Filed: Mar. 19, 2008

(65) Prior Publication Data
US 2008/0231340 A1   Sep. 25, 2008

(30) Foreign Application Priority Data
Mar. 20, 2007   (JP) .............................. 2007-073317

(51) Int. Cl.
*H03L 5/00* (2006.01)
(52) U.S. Cl. ........................................ 327/333; 326/80
(58) Field of Classification Search ................. 327/333; 326/63, 68, 80, 81; 365/189.11
See application file for complete search history.

(56) References Cited

U.S. PATENT DOCUMENTS

| 6,124,628 | A | 9/2000 | Fujihira et al. |
| 6,323,539 | B1 | 11/2001 | Fujihira et al. |
| 6,326,831 | B1 * | 12/2001 | Kumagai .................... 327/333 |
| 6,452,365 | B1 | 9/2002 | Majumdar et al. |
| 6,501,321 | B2 * | 12/2002 | Kumagai .................... 327/333 |
| 6,646,469 | B2 * | 11/2003 | Yushan ........................ 326/68 |
| 7,239,181 | B2 | 7/2007 | Himi et al. |

FOREIGN PATENT DOCUMENTS

| DE | 102006037336 | 10/2006 |
| JP | A-2005-175130 | 6/2005 |

OTHER PUBLICATIONS

Texas Instruments, 3.3-V/5-V High-Speed Digital Isolators, Jan., 2006.
Office Action dated Apr. 15, 2009 from German Patent Office in the corresponding DE Application No. 102008014916.0 (and English Translation).

* cited by examiner

*Primary Examiner*—Long Nguyen
(74) *Attorney, Agent, or Firm*—Posz Law Group, PLC

(57) ABSTRACT

A level shift circuit includes a first capacitor circuit including capacitors connected in series between a ground and a predetermined potential, a first trigger circuit coupled to the predetermined potential side of the first capacitor circuit, an input terminal coupled to the ground side of the first capacitor circuit, a second capacitor circuit including capacitors connected in series between the ground and the predetermined potential, a second trigger circuit coupled to the predetermined potential side of the second capacitor circuit, an inverter coupled between the input terminal and the ground potential side of the second capacitor circuit, and a SR latch circuit having a first input coupled to an output of the first trigger circuit and a second input coupled to an output of the second trigger circuit.

6 Claims, 10 Drawing Sheets

FIG. 3A
FIG. 3B
FIG. 3C
FIG. 3D
FIG. 3E
FIG. 3F
FIG. 3G
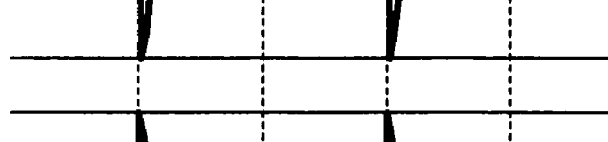
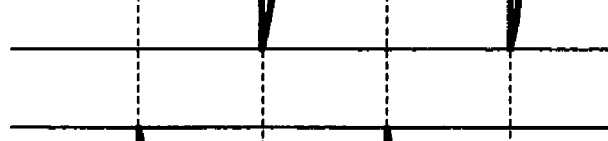
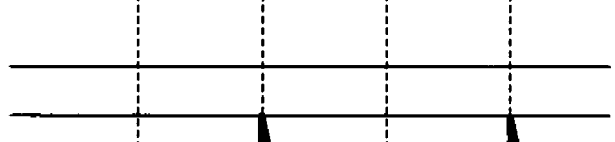
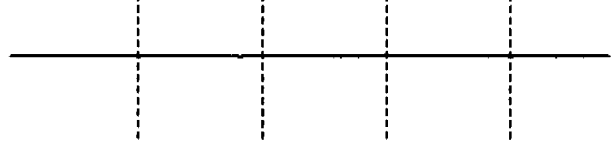
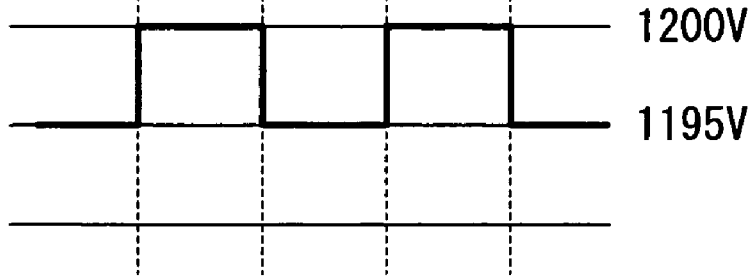

LEVEL SHIFT CIRCUIT

CROSS REFERENCE TO RELATED APPLICATION

This application is based on and incorporates herein by reference Japanese Patent Application No. 2007-73317 filed on Mar. 20, 2007.

FIELD OF THE INVENTION

The present invention relates to a level shift circuit for a high voltage integrated circuit such as an inverter driver circuit.

BACKGROUND OF THE INVENTION

A level shift circuit having a high withstand voltage has been disclosed, for example, in U.S. Pat. No. 7,239,181 corresponding to JP-A-2006-148058. As shown in FIG. 12, a level shift circuit 100 disclosed in U.S. Pat. No. 7,239,181 includes transistors Tr1-Trn that are electrically isolated from each other and connected in series between a ground potential and a predetermined potential Vs. The transistor Tr1 located at the ground potential side is set as a first stage transistor, and the transistor Trn located at the predetermined potential Vs side is set as an n-th stage transistor. The gate terminal of the first stage transistor Tr1 is set as an input terminal of the level shift circuit 100. The level shift circuit 100 further includes resistors R1-Rn that are connected in series between the ground potential and the predetermined potential Vs. The resistor R1 located at the ground potential side is set as a first stage resistor, and the resistor Rn located at the predetermined potential Vs side is set as an n-th stage resistor. Diodes D2-Dn are respectively interposed between the gates of the transistors Tr2-Trn and ground potential side terminals of the transistors Tr2-Trn.

The gates of the transistors Tr2-Trn are respectively coupled to nodes between the resistors R1-Rn. An output of the level shift circuit 100 is obtained from a predetermined potential Vs side terminal of the n-th transistor. The transistors Tr1-Trn are formed on a n-conductive type semiconductor layer on a buried insulating layer of a silicon-on-insulator substrate. The semiconductor layer are divided into field regions by isolation trenches extending to the buried insulating layer. The transistors Tr1-Trn are formed in the respective field regions and electrically isolated from each other The isolation trenches are arranged in a multiplexed manner. For example, the transistors Tr1-Trn are laterally diffused metal oxide semiconductors (LDMOS).

Thus, although each of the transistors Tr1-Trn has a normal withstand voltage and is manufactured at low cost by a typical manufacturing process, the level shift circuit 100 as a whole can have a high withstand voltage. However, the level shift circuit 100 has a transistor, a resistor, and a diode at each stage. Therefore, the level shift circuit 100 is increased in size. The level shift circuit 100 may be damaged by a surge that is caused when the predetermined potential Vs swings. The level shift circuit 100 can be protected from the surge by adding a capacitor at each stage. However, the addition of the capacitor results in a further increase in size of the level shift circuit 100.

SUMMARY OF THE INVENTION

In view of the above-described problem, it is an object of the present invention to provide a level shift circuit having a reduced size and configured to be protected from a surge.

According to an aspect of the present invention, a level shift circuit includes first and second capacitor circuits, first and second trigger circuit, an input terminal, an inverter element, and a set-reset latch circuit. The first capacitor circuit includes a plurality of capacitors coupled in series between a ground potential and a predetermined potential. The input terminal is coupled to a ground potential side of the first capacitor circuit and receives an input pulse signal. The first trigger circuit is coupled to a predetermined potential side of the first capacitor circuit and outputs a first edge signal associated with only one of rising and falling edges of the input pulse signal. The second capacitor circuit includes a plurality of capacitors coupled in series between the ground potential and the predetermined potential. The inverter element is coupled between the input terminal and the ground potential side of the second capacitor circuit and outputs an inverted pulse signal of the input pulse signal. The second trigger circuit is coupled to the predetermined potential side of the second capacitor circuit and outputs a second edge signal associated with only one of rising and falling edges of the inverted pulse signal. The set-reset latch circuit has a first input coupled to an output of the first trigger circuit and a second input coupled to an output of the second trigger circuit. The second edge signal has the same polarity as the first edge signal.

BRIEF DESCRIPTION OF THE DRAWINGS

The above and other objectives, features and advantages of the present invention will become more apparent from the following detailed description made with check to the accompanying drawings. In the drawings:

FIGS. 3A-3G are timing diagrams of the level shift circuit of FIG. 1;

DETAILED DESCRIPTION OF THE PREFERRED EMBODIMENTS

First embodiment

Figure 1:
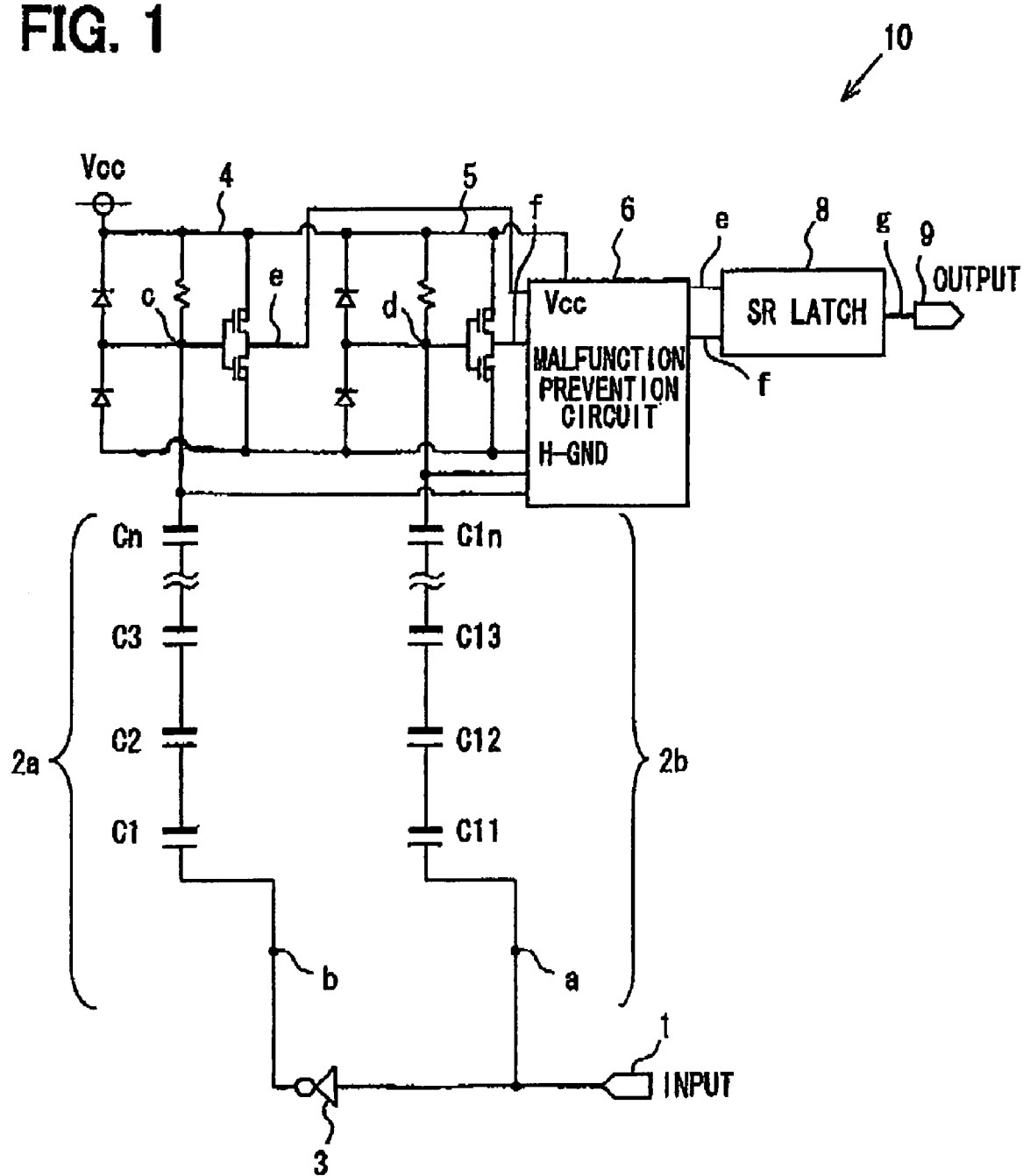
FIG. 1 is a circuit diagram illustrating a level shift circuit according to a first embodiment of the present invention.

Referring to FIG. 1, a level shift circuit 10 according to a first embodiment of the present invention includes an input terminal 1, first and second capacitor circuits 2b, 2a, an inverter circuit (i.e., NOT gate) 3, first and second trigger output circuits 5, 4, a set-reset (SR) latch circuit 8, and an output terminal 9. The level shift circuit 10 has a maximum withstand voltage of 1300 volts and level-shifts an input signal received by the input terminal 1 to a desired level between a ground potential and a predetermined high potential (i.e., power source voltage) Vcc greater than the ground potential. The level-shifted signal is outputted from the output terminal 9.

The first capacitor circuit 2b includes a plurality of capacitors C11-C1n coupled in series between the ground potential and the high potential Vcc, where n is a positive integer from two to nine. The first trigger output circuit 5 includes a diode, a resistor, and an inverter circuit and is coupled to the first capacitor circuit 2b at the high potential Vcc side. The input terminal 1 is coupled to the first capacitor circuit 2b at the ground potential side. The number of the capacitors C11-C1n can be changed as needed. Therefore, the first capacitor circuit 2b can include ten or more capacitors.

The second capacitor circuit 2a includes a plurality of capacitors C1-Cn coupled in series between the ground potential and the high potential Vcc. The second trigger output circuit 4 includes a diode, a resistor, and an inverter circuit and is coupled to the second capacitor circuit 2a at the high potential Vcc side. The inverter circuit 3 is coupled between the second capacitor circuit 2a and the input terminal 1. The SR latch circuit 8 has a first input coupled to an output of the first trigger output circuit 5, a second input coupled to an output of the second trigger output circuit 4, and an output coupled to the output terminal 9. The number of the capacitors C1-Cn can be changed as needed. Therefore, the second capacitor circuit 2b can include ten or more capacitors.

As shown in FIG. 1, the level shift circuit 10 can include a malfunction prevention circuit 6 as an option. The malfunction prevention circuit 6 includes a delay circuit (not shown) coupled to the output of each of the first and second trigger output circuits 4, 5 and a malfunction detection circuit (not shown) coupled to an output of each of the first and second capacitor circuits 2b, 2a. The malfunction prevention circuit 6 prevents an error from occurring in the level shifted signal outputted from the output terminal 9, if the high potential Vcc swings between zero volts and several hundreds of volts. When the high potential Vcc swings between zero volts and several hundreds of volts, a parasitic current flows in the capacitors C1-Cn, and C11-C1n. The malfunction prevention circuit 6 receives signal inputs from the first and second capacitor circuits 2b, 2a. In a normal condition, the signal inputs have an inverted phase. In an abnormal condition, where the parasitic current flows, the signal inputs have a common phase. When receiving the signal inputs with the common phase, the malfunction prevention circuit 6 prevents the signal inputs from being inputted to the SR latch circuit 8, thereby preventing the error from occurring in the level-shifted signal outputted from the output terminal 9.

As described previously, the level shift circuit 10 has the high withstand voltage of 1300 volts. A single capacitor with a withstand voltage of 1300 volts is costly, because such a high withstand voltage capacitor requires an oxide film with a thickness of tens of micrometers. Further, when the level shift circuit 10 is constructed by using an silicon-on-insulator (SOI) substrate, a thickness of a buried oxide film of the SOI substrate needs to be increased to tens of micrometers. Since it is difficult to equally increase the thickness of the buried oxide film, the level shift circuit 10 may be reduced in reliability due to thickness variation. Therefore, if the level shift circuit 10 uses such a high withstand voltage capacitor, the manufacturing cost of the level shift circuit 10 is increased, and the reliability of the level shift circuit 10 is reduced. According to the first embodiment, each of the capacitors C11-C1n of the first capacitor circuit 2b has a normal withstand voltage of between 100 volts and 200 volts. Also, each of the capacitors C1-Cn of the second capacitor circuit 2a has a normal withstand voltage of between 100 volts and 200 volts. The withstand voltage of 1300 volts is achieved by coupling the normal withstand voltage capacitors in series. In such an approach, the level shift circuit 10 can be manufactured at low cost and have high reliability.

Figure 2:
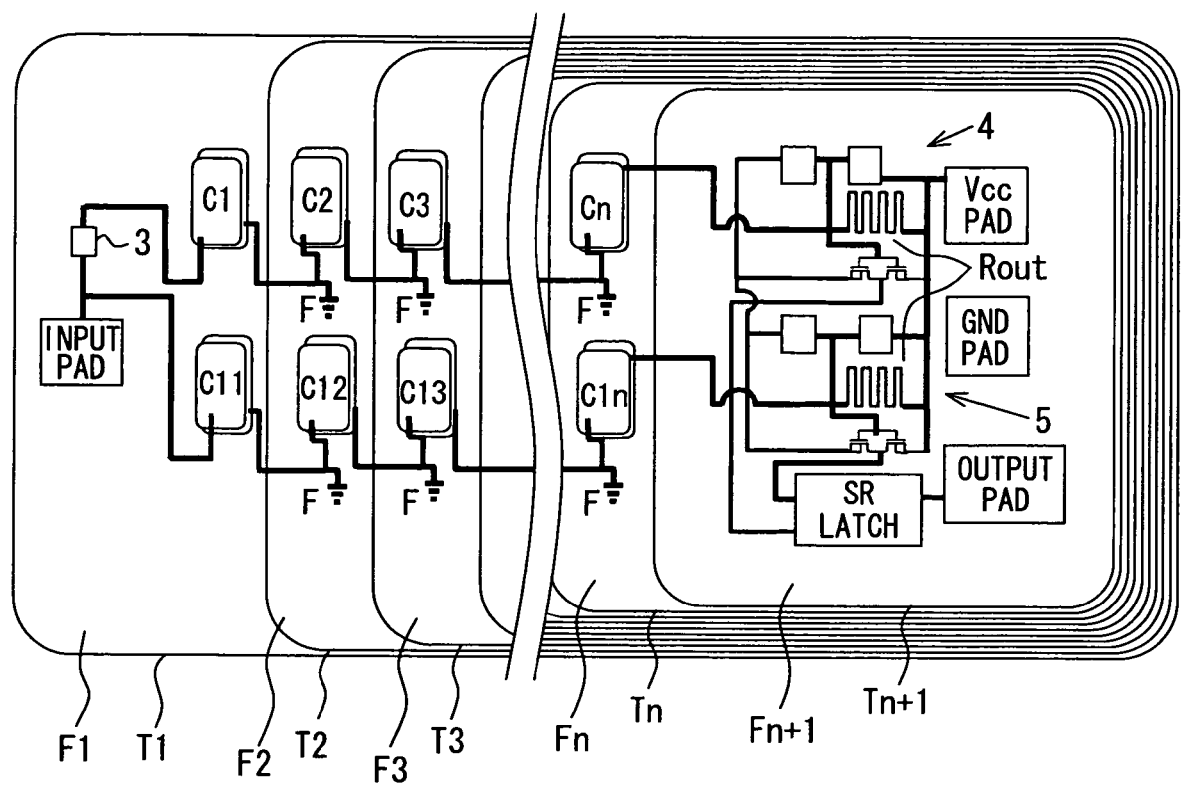
FIG. 2 is a diagram illustrating a top view of the level shift circuit of FIG. 1.

A structure of the level shift circuit 10 is described below with reference to FIG. 2. The level shift circuit 10 is constructed by using a silicon-on-insulator (SOI) substrate. The SOI substrate includes a supporting substrate, an buried oxide film on the supporting substrate, and a semiconductor layer on the buried oxide film. The semiconductor layer includes field regions F1-Fn+1 that are respectively enclosed by isolation trenches T1-Tn+1, each of which extends from a surface of the semiconductor layer to the buried oxide film. Thus, the field regions F1-Fn+1 are electrically isolated from each other by the isolation trenches T1-Tn+1. As shown in FIG. 2, the isolation trenches T1-Tn+1 are arranged in a multiplexed manner. Specifically, the isolation trench Tm is arranged inside the isolation trench Tm+1, where $1 \leq m \leq n$. The capacitors C11-C1n of the first capacitor circuit 2b are formed in the field regions F1-Fn, respectively, and connected in series. Likewise, the capacitors C1-Cn of the second capacitor circuit 2a are formed in the field regions F1-Fn, respectively, and connected in series. A potential of each of the field regions F1-Fn is fixed to F.

In addition to the capacitors C1, C11, an input pad and the inverter 3 are formed in the field region F1. The first and second trigger output circuits 5, 4, an output resistor Rout, the SR latch circuit 8, a Vcc pad, and an output pad are formed in the field region Fn+1.

An operation of the level shift circuit 10 is described below with reference to FIGS. 3A-3G FIGS. 3A-3G respectively illustrate signal waveforms appearing at points a-g of FIG. 1 when a pulse signal is inputted to the input terminal 1.

As shown in FIG. 3A, a signal waveform of the input signal appears at the point a. For example, the input signal ranges from 0 to 5 volts. As shown in FIG. 3B, a signal waveform of an inverted signal of the input signal appears at the point b. As shown in FIG. 3C, a momentary voltage change of the capacitors C1-Cn due to the input signal appears at the point c located on the high potential Vcc side of the second capacitor circuit 2a. As shown in FIG. 3D, a momentary voltage change of the capacitors C11-C1n due to the input signal appears at the point d located on the high potential Vcc side of the first capacitor circuit 2b. As shown in FIG. 3E, an edge pulse signal associated with the momentary voltage change appearing at point c appears at the point e, which is the output of the second trigger output circuit 4. As shown in FIG. 3F, an edge pulse signal associated with the momentary voltage change appearing at point d appears at the point f, which is the output of the first trigger output circuit 5. As shown in FIG. 3G, the edge pulse signal outputted from the second trigger output circuit 4 sets the SR latch circuit 8, and the edge pulse signal outputted from the first trigger output circuit 5 resets the SR latch circuit 8. Thus, the input signal ranging from 0 to 5 volts is level-shifted to 1195 to 1200 volts.

As described above, the level shift circuit 10 according to the first embodiment of the present invention is constructed with multiple capacitors coupled in series. In such an approach, the level shift circuit 10 can be constructed with a reduced number of elements and accordingly can be small in size. Further, the level shift circuit 10 includes two capacitor circuits 2a, 2b. In such an approach, the level shift circuit 10 can be protected from a surge, even when the high potential Vcc swings.

Second Embodiment

A second embodiment of the present invention is described below with reference to FIGS. 4-7. In the second embodiment, each of the capacitors C11-C1n of the first capacitor circuit 2b is constructed with multiple capacitors coupled in parallel. Thus, each of the capacitors C11-C1n can have an increased capacitance. Likewise, each of the capacitors C1-Cn of the second capacitor circuit 2b is constructed with multiple capacitors coupled in parallel. Thus, each of the capacitors C1-Cn can have an increased capacitance. Although only the capacitor C1 is described below, each of the capacitors C2-Cn, and C11-C1n has a similar structure to the capacitor C1.

Figure 5:
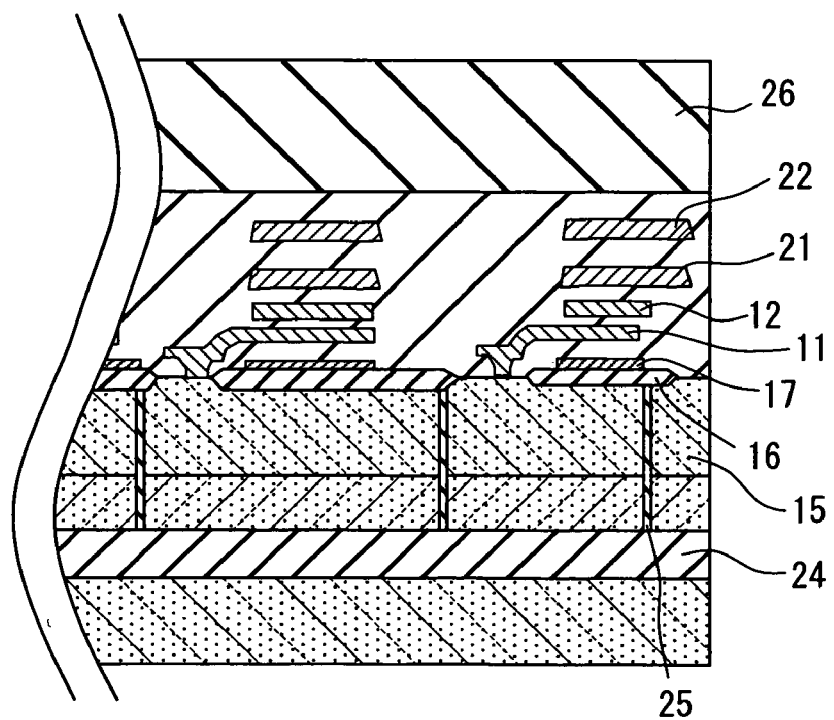
FIG. 5 is a diagram illustrating a cross-sectional view taken along line V-V of FIG. 4.

As shown in FIG. 5, the capacitor C1 is formed on a semiconductor layer 15 of a SOI substrate having a buried oxide film 24 and coated with a passivation film 26. The SOI substrate includes a plurality of field regions respectively enclosed by a plurality of isolation trenches, each of which extends from a surface of the semiconductor layer 15 to the buried oxide film 24. Thus, the field regions are electrically isolated from each other by the isolation trenches.

Figure 4:
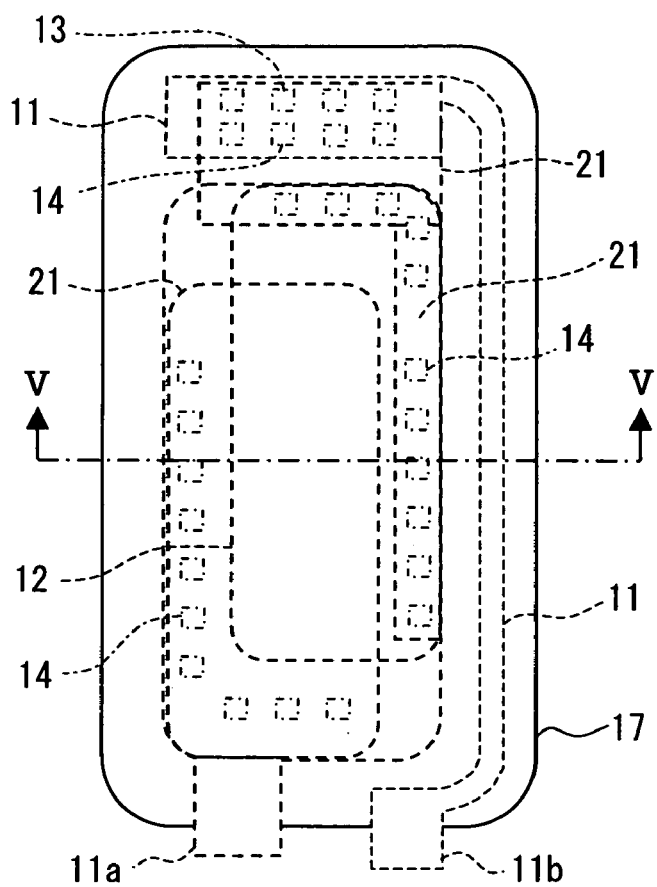
FIG. 4 is a diagram illustrating a top perspective view of a capacitor in a level shift circuit according to a second embodiment of the present invention.
Figure 6:
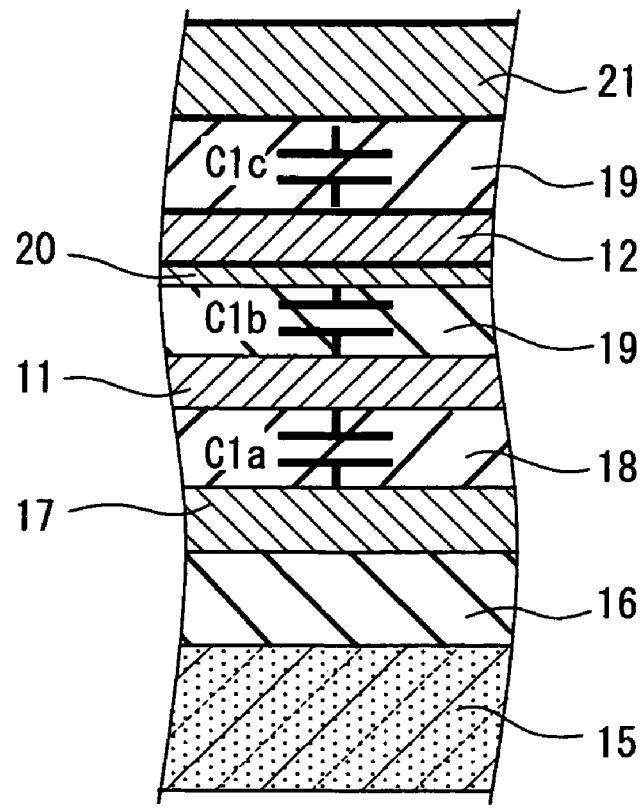
FIG. 6 is a diagram illustrating a enlarged view of FIG. 5.

Specifically, as shown in FIGS. 4-6, the capacitor C1 is constructed in such a manner that a first (1st) aluminum electrode 11, an one-and-halfth (1.5th) aluminum electrode 12, a polysilicon electrode 17 formed on a local oxidation of silicon (LOCOS) film 16, a second (2nd) aluminum electrode 21, a third (3rd) aluminum electrode 22, and a CrSi resistor 20 are stacked together through a borophosphosilicate glass (BPSG) film 18 and an interlayer dielectric film 19 and electrically connected together through a contact 13 and a via 14. The first aluminum electrode 11 has a ground side terminal 11a and a high potential Vcc side terminal 11b.

Figure 7:
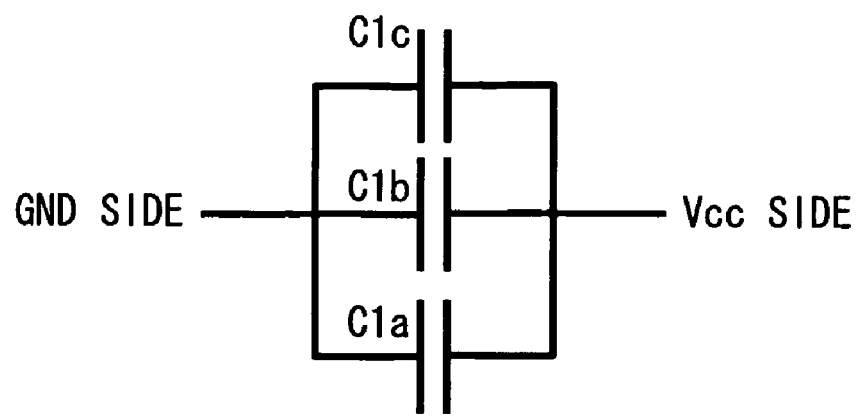
FIG. 7 is a diagram illustrating an equivalent circuit of the capacitor of FIG. 4.

For example, the capacitor C1 is constructed with three capacitors C1a, C1b, and C1c coupled in parallel. As shown in FIG. 6, the capacitor C1a is constructed with the polysilicon electrode 17, the first aluminum electrode 11, and the BPSG film 18 interposed between the polysilicon electrode 17 and the first aluminum electrode 11. The capacitor C1b is constructed with the first aluminum electrode 11, the one-and-halfth aluminum electrode 12, and the interlayer dielectric film 19 interposed between the first aluminum electrode 11 and the one-and-halfth aluminum electrode 12. The capacitor C1c is constructed with the one-and-halfth aluminum electrode 12, the second aluminum electrode 21, and the interlayer dielectric film 19 interposed between the one-and-halfth aluminum electrode 12 and the second aluminum electrode 21. As shown in FIG. 7, the capacitors C1a, C1b, and C1c are coupled in parallel to construct the capacitor C1. As described above, each of the capacitors C2-Cn, and C11-C1c has the similar structure to the capacitor C1. Thus, each of the capacitors C1-Cn, and C11-C1n of the first and second capacitor circuits 2b, 2a can have the increased capacitance.

For example, the interlayer dielectric film 19 can be made of silicon oxide (SiO2). Alternatively, to further increase the capacitance, the interlayer dielectric film 19 can include at least one of a NO (Si3N4/SiO2) layer, a high-k dielectric film (e.g., Ta2O5), and a ferroelectric film (e.g., PZT or SrTiO3).

Third Embodiment

Figure 8:
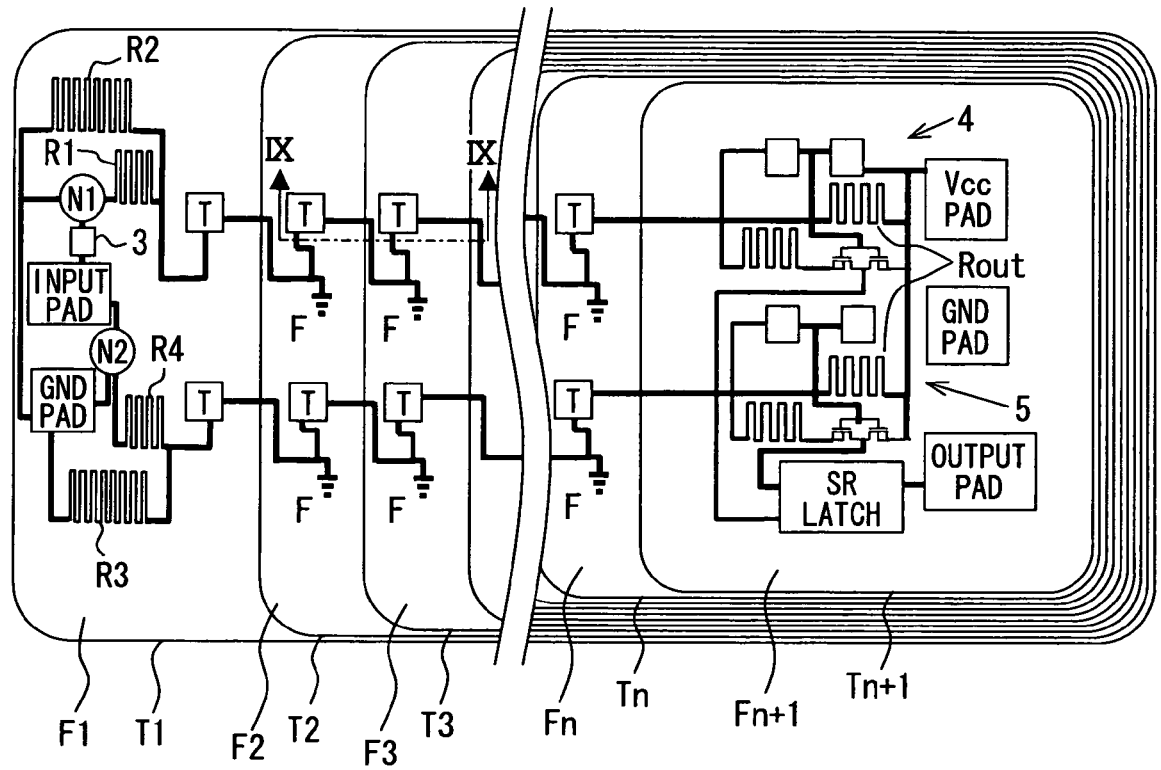
FIG. 8 is a diagram illustrating a top view of a level shift circuit according to a third embodiment of the present invention.

A third embodiment of the present invention is described below with reference to FIGS. 8 and 9. In the third embodiment, each of the capacitors C11-C1n and C1-Cn of the first and second capacitor circuits 2b, 2a is constructed by an isolation trench.

A SOI substrate includes a supporting substrate 31, a buried oxide film 32 on the supporting substrate 31, and a semiconductor layer 33 on the buried oxide film 32. An interlayer dielectric film 38 is disposed on the semiconductor layer 33. The SOI substrate includes a plurality of field regions F1-Fn+1 respectively enclosed by a plurality of isolation trenches T1-Tn+1, each of which extends from a surface of the semiconductor layer 33 to the buried oxide film 32. Thus, the field regions F1-Fn+1 are electrically isolated from each other by the isolation trenches T1-Tn+1. A 100-volt clamping diode T is formed in each of the field regions F1-Fn+1.

Figure 9:
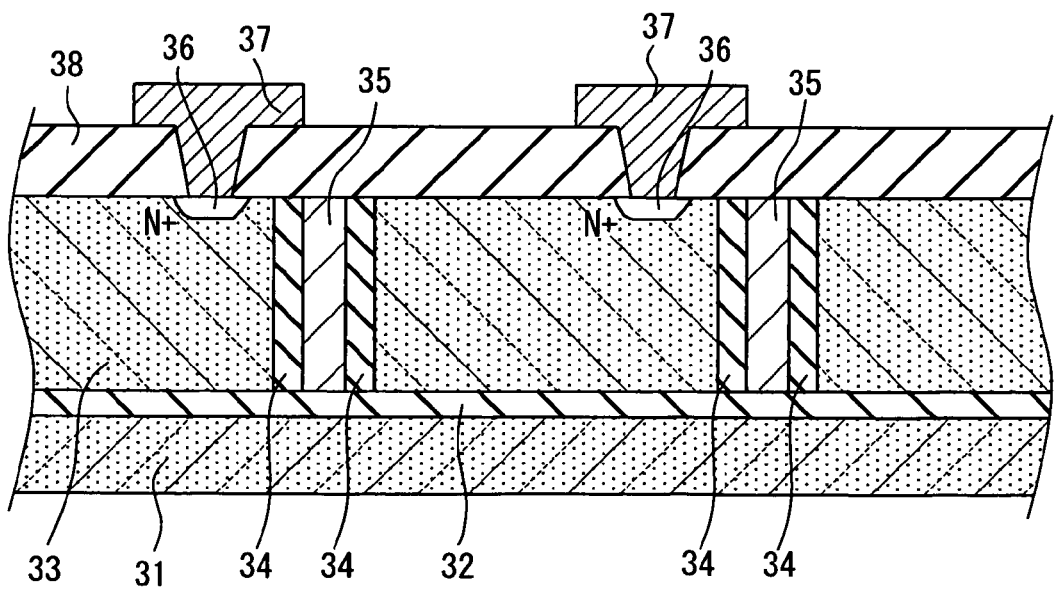
FIG. 9 is a diagram illustrating a cross-sectional view taken along line IX-IX of FIG. 8.

As shown in FIG. 9, an aluminum electrode 37 is coupled to each of the field regions F1-Fn+1 through a N+ diffusion region (i.e., contact region) 36. Each of the isolation trenches T1-Tn+1 has an inner side wall covered with an oxide film 34 and is filled with a buried polysilicon 35. Thus, the buried polysilicon 35 is surrounded by the oxide film 34 so that each of the isolation trenches T1-Tn+1 can serve as a capacitor.

Fourth Embodiment

Figure 10:
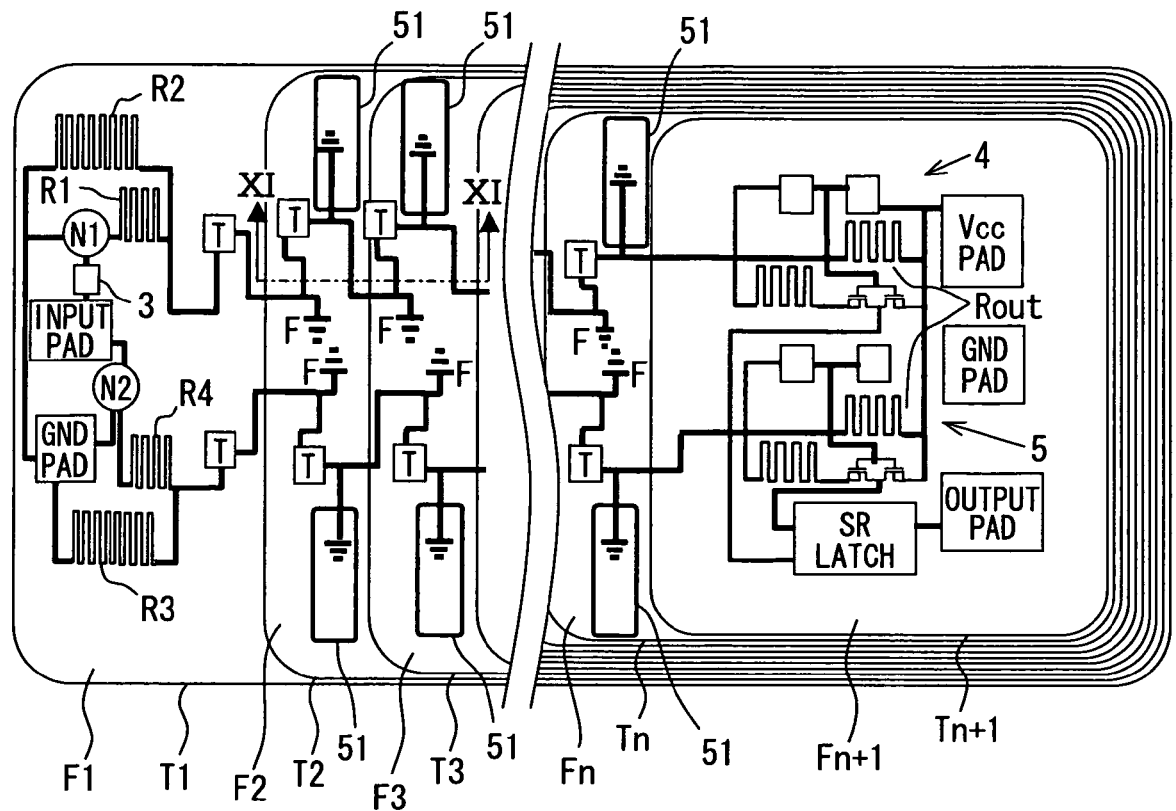
FIG. 10 is a diagram illustrating a top view of a level shift circuit according to a fourth embodiment of the present invention.

A fourth embodiment of the present invention is described below with reference to FIGS. 10 and 11. In the fourth embodiment, each of the capacitors C11-C1n and C1-Cn of the first and second capacitor circuits 2b, 2a is constructed by both an isolation trench and a gate trench to increase a capacitance.

A SOI substrate includes a supporting substrate 41, a buried oxide film 42 on the supporting substrate 41, and a semiconductor layer 43 on the buried oxide film 42. An interlayer dielectric film 48 is disposed on the semiconductor layer 43. The SOI substrate includes a plurality of field regions F1-Fn+1 respectively enclosed by a plurality of insulation trenches T1-Tn+1, each of which extends from a surface of the semiconductor layer 43 to the buried oxide film 42. Thus, the field regions F1-Fn+1 are electrically isolated from each other by the isolation trenches T1-Tn+1. A 100-volt clamping diode T is formed in each of the field regions F1-Fn+1.

Figure 11:
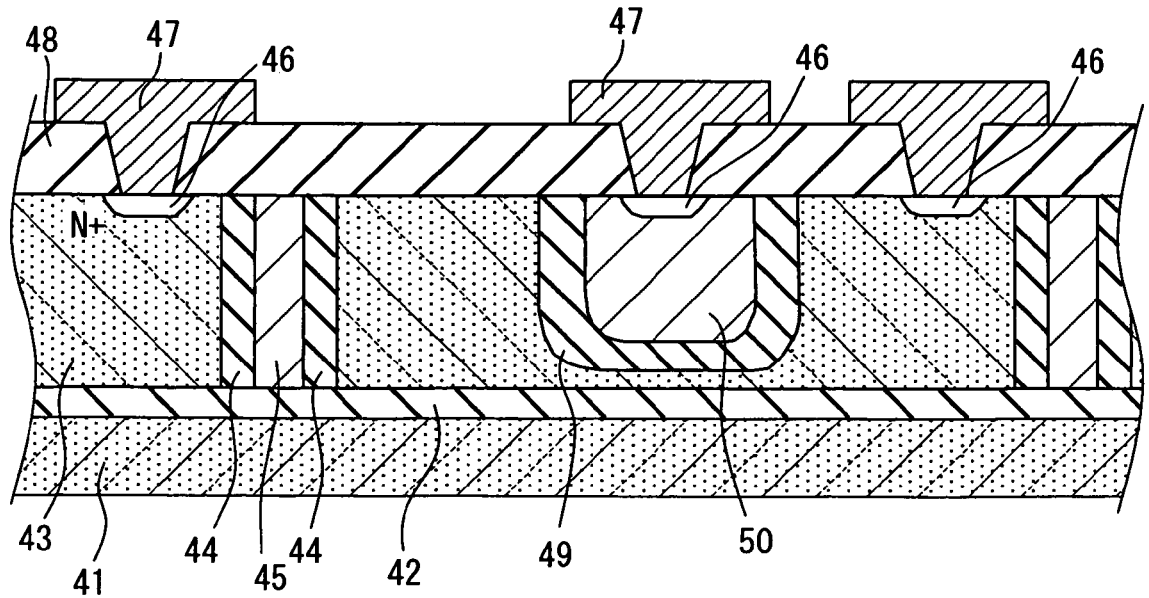
FIG. 11 is a diagram illustrating a cross-sectional view taken along line XI-XI of FIG. 10.
Figure 12:
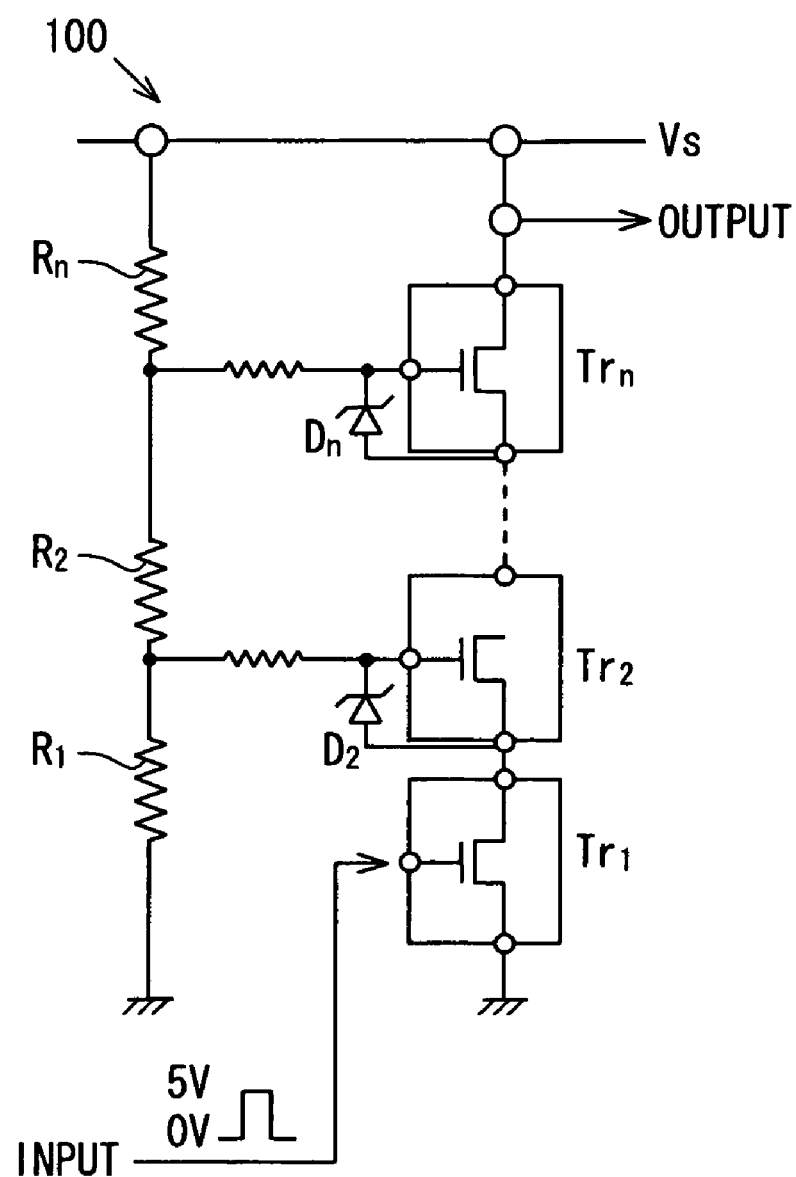
FIG. 12 is a circuit diagram illustrating a prior-art level shift circuit.

As shown in FIG. 11, an aluminum electrode 47 is coupled to each of the field regions F1-Fn+1 through a N+ diffusion region 46. Each of the isolation trenches T1-Tn+1 has an inner side wall covered with an oxide film 44 and is filled with a buried polysilicon 45. Thus, the buried polysilicon 45 is surrounded by the oxide film 44 so that each of the isolation trenches T1-Tn+1 can serve as a capacitor. Further, a gate trench 51 is formed in each of the field regions F1-Fn+1. Unlike the isolation trenches T1-T+1, the gate trench 51 does not reach the buried oxide film 42. The gate trench 51 has inner side and bottom walls covered with an oxide film 49 and is filled with a buried polysilicon 50. Thus, the buried polysilicon 50 is surrounded by the oxide film 49. The aluminum electrode 47 is coupled to the buried polysilicon 50 through the N+ diffusion region 46 so that the gate trench 51 can serve as a capacitor.

(Modifications)

Figure 13:
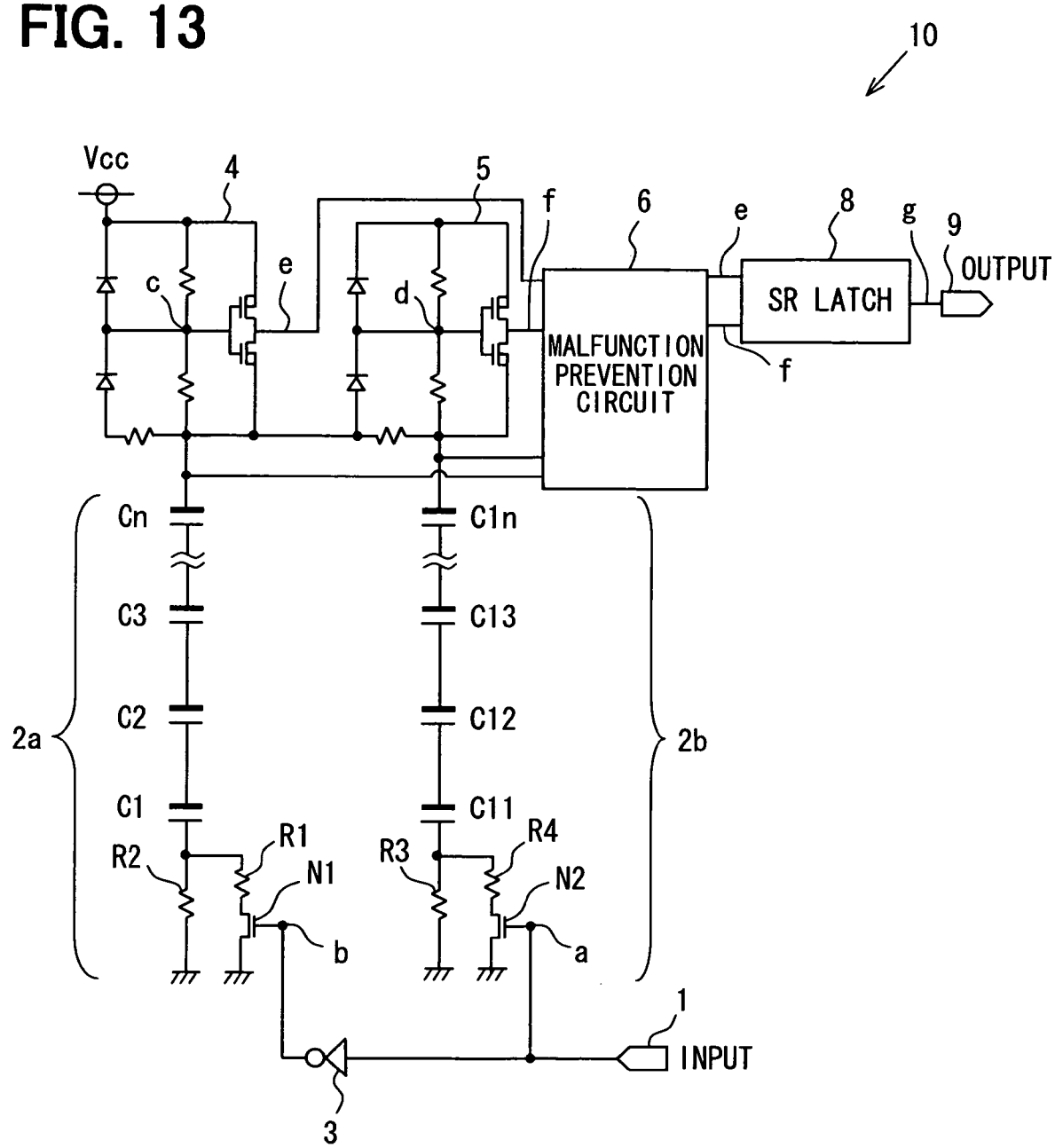
FIG. 13 is a circuit diagram illustrating a level shift circuit according to a modification of the first embodiment.
Figure 14:
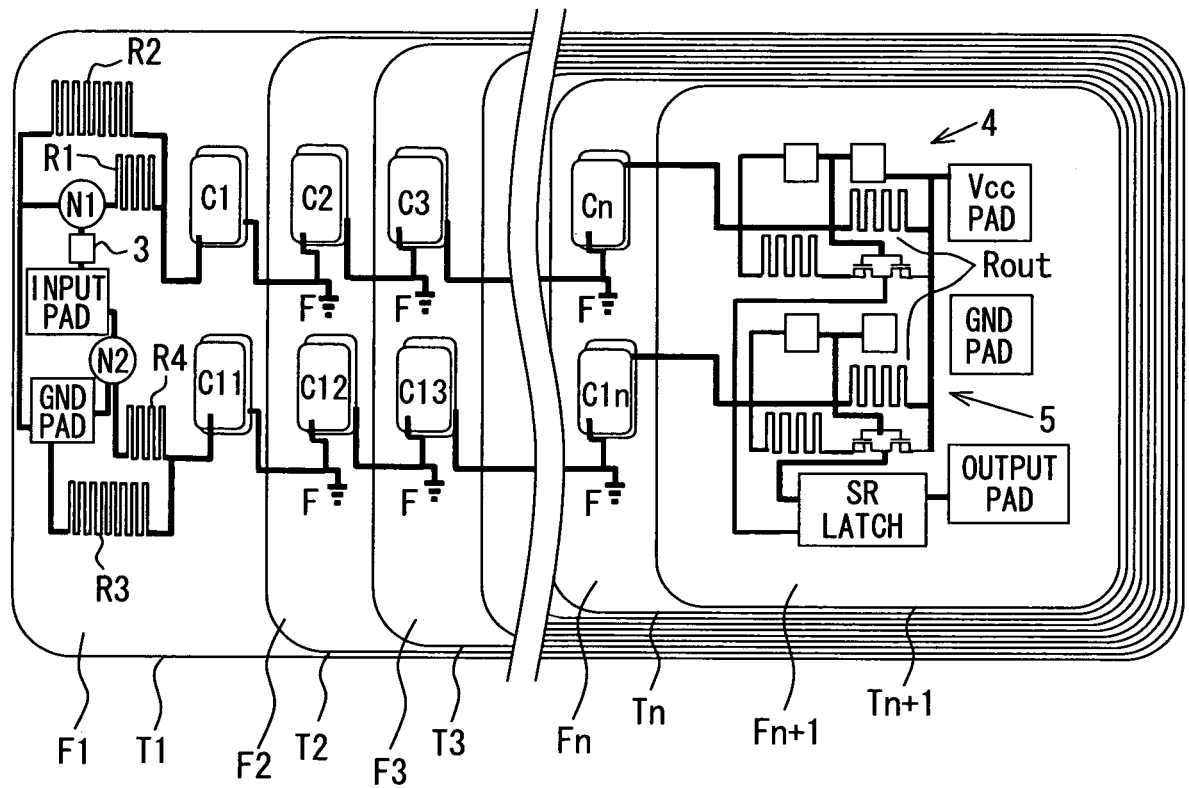
FIG. 14 is a diagram illustrating a top view of the level shift circuit of FIG. 13.

The embodiments described above may be modified in various ways. For example, the first embodiments shown in FIGS. 1, 2 may be modified as shown in FIGS. 13, 14, in which resistors R1-R4, and LDMOSs N1, N2 are added. In the fourth embodiment, each of the capacitors C11-C1n and C1-Cn of the first and second capacitor circuits 2b, 2a can be constructed by only the gate trench 51.

Such changes and modifications are to be understood as being within the scope of the present invention as defined by the appended claims.

What is claimed is:

1. A level shift circuit comprising:
    a first capacitor circuit including a plurality of capacitors coupled in series between a ground potential and a predetermined potential;
    an input terminal coupled to a ground potential side of the first capacitor circuit and configured to receive an input pulse signal;
    a first trigger circuit coupled to a predetermined potential side of the first capacitor circuit and configured to output a first edge signal associated with only one of rising and falling edges of the input pulse signal;
    a second capacitor circuit including a plurality of capacitors coupled in series between the ground potential and the predetermined potential;
    an inverter element coupled between the input terminal and the ground potential side of the second capacitor circuit and configured to output an inverted pulse signal of the input pulse signal;
    a second trigger circuit coupled to the predetermined potential side of the second capacitor circuit and configured to output a second edge signal associated with only one of rising and falling edges of the inverted pulse signal; and
    a set-reset latch circuit having a first input coupled to an output of the first trigger circuit and a second input coupled to an output of the second trigger circuit,
    wherein the second edge signal has a same polarity as the first edge signal.

2. The level shift circuit according to claim 1,
    wherein the capacitors of the first and second capacitor circuits are formed in respective field regions of a semiconductor substrate, and
    wherein the field regions are electrically insulated from each other by isolation trenches and arranged in a multiplexed manner.

3. The level shift circuit according to claim 2,
    wherein each field region includes a plurality of conductor layers and a plurality of interlayer dielectric films respectively interposed between the conductor layers to construct a plurality of film capacitor elements, and
    wherein the film capacitor elements are coupled in parallel to construct a corresponding one of the capacitors of the first and second capacitor circuits.

4. The level shift circuit according to claim 3,
    wherein the interlayer dielectric films include at least one of a NO film, a high-k dielectric film, and a ferroelectric film.

5. The level shift circuit according to claim 1,
    wherein the capacitors of the first and second capacitor circuits are formed in respective field regions of a semiconductor layer on a buried oxide film of a silicon-on-insulator substrate,
    wherein the field regions are electrically insulated from each other by a plurality of isolation trenches, each isolation trench being extending from a surface of the semiconductor layer to the buried oxide film, and
    wherein each isolation trench has an inner side wall covered with an oxide film and is filled with a buried polysilicon to construct a corresponding one of the capacitors of the first and second capacitor circuits.

6. The level shift circuit according to claim 1,
    wherein the capacitors of the first and second capacitor circuits are formed in respective field regions of a semiconductor layer on a buried oxide film of a silicon-on-insulator substrate,
    wherein the field regions are electrically insulated from each other by a plurality of isolation trenches, each isolation trench being extending from a surface of the semiconductor layer to the buried oxide film,
    wherein a plurality of gate trenches is formed in the respective field regions, and
    wherein each gate trench has inner side and bottom walls covered with an oxide film and is filled with a buried polysilicon having an electrode to construct a corresponding one of the capacitors of the first and second capacitor circuits.

* * * * *